United States Patent
Ruster et al.

(10) Patent No.: US 12,332,290 B2
(45) Date of Patent: Jun. 17, 2025

(54) MEASUREMENT SYSTEM FOR ANALYSING RADIO FREQUENCY SIGNALS, AND METHOD OF OPERATING THE SAME

(71) Applicant: Rohde & Schwarz GmbH & Co. KG, Munich (DE)

(72) Inventors: Thomas Ruster, Munich (DE); Miguel Bueno Diez, Munich (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 464 days.

(21) Appl. No.: 17/949,774

(22) Filed: Sep. 21, 2022

(65) Prior Publication Data

US 2023/0126884 A1 Apr. 27, 2023

(30) Foreign Application Priority Data

Oct. 26, 2021 (EP) .................................... 21204629

(51) Int. Cl.
*G01R 29/08* (2006.01)
*G01R 1/24* (2006.01)

(52) U.S. Cl.
CPC .......... *G01R 29/0885* (2013.01); *G01R 1/24* (2013.01)

(58) Field of Classification Search
None
See application file for complete search history.

(56) References Cited

U.S. PATENT DOCUMENTS

| | | | | |
|---|---|---|---|---|
| 10,509,065 B1 * | 12/2019 | Shaffer | | G01R 29/0885 |
| 10,823,775 B2 * | 11/2020 | Anderson | | G01R 29/0878 |
| 10,979,147 B2 * | 4/2021 | Gordon | | H04B 10/503 |
| 11,435,386 B2 * | 9/2022 | Holloway | | G01R 29/0892 |
| 11,592,469 B2 * | 2/2023 | Anderson | | G01R 29/0885 |
| 11,843,420 B1 * | 12/2023 | Caliga | | H04B 10/70 |
| 12,000,877 B2 * | 6/2024 | Anderson | | G01R 29/0892 |

(Continued)

FOREIGN PATENT DOCUMENTS

| | | | | |
|---|---|---|---|---|
| EP | 3394670 B1 | 2/2020 | | |
| JP | 2020052020 A | * | 4/2020 | H01S 1/06 |

OTHER PUBLICATIONS

Meyer et al. "Waveguide-coupled Rydberg spectrum analyzer from 0 to 20 GHz" ArXiv:2009.14383v4 [physics.atom-ph] May 20, 2021 (Year: 2021).*

(Continued)

*Primary Examiner* — Thomas R Artman
(74) *Attorney, Agent, or Firm* — DITTHAVONG, STEINER & MLOTKOWSKI

(57) ABSTRACT

Disclosed is a measurement system for analysing RF signals. The measurement system includes an optically transparent enclosure including an optically pumpable gas, and a printed circuit board, PCB including an electrical transmission line for guiding the RF signal to be analyzed through the enclosure and a reflective planar face. The measurement system includes an optical pump for emitting preferably coherent light onto the reflective planar face, and a detector for detecting an optical property of the emitted light being reflected by the reflective planar face. This provides a better laser/microwave overlap in atomic vapor quantum sensing setups, where it is crucial to overlap the regions with highest laser intensity and microwave field strength.

15 Claims, 3 Drawing Sheets

(56) References Cited

U.S. PATENT DOCUMENTS

| | | | |
|---|---|---|---|
| 2019/0187198 A1* | 6/2019 | Anderson | G01R 29/0878 |
| 2020/0292606 A1* | 9/2020 | Holloway | G01R 29/0892 |
| 2020/0295838 A1* | 9/2020 | Gordon | H04B 10/548 |
| 2022/0196716 A1* | 6/2022 | Anderson | G01R 29/10 |
| 2023/0126884 A1* | 4/2023 | Ruster | H01S 3/091 |
| | | | 359/326 |
| 2023/0243881 A1* | 8/2023 | Anderson | G01R 29/10 |
| | | | 324/97 |
| 2024/0310422 A1* | 9/2024 | Moore | G01R 29/0878 |

OTHER PUBLICATIONS

Kinoshita et al. "2-D Polarimetry of Visualized Radio Frequency Waves Using Cesium Vapor Atoms" IEEE Transactions on Instrumentation and Measurement, vol. 70 (2021) (Year: 2021).*

* cited by examiner

MEASUREMENT SYSTEM FOR ANALYSING RADIO FREQUENCY SIGNALS, AND METHOD OF OPERATING THE SAME

TECHNICAL FIELD

The present disclosure relates to signal analysis in microwave communication, and in particular to a measurement system for analysing RF signals and a method of operating the measurement system.

BACKGROUND ART

Atom-based quantum effects may be used in developing quantum sensors for various physical quantities, as is known in the art.

For example, in highly excited energy states/levels wherein an outermost electron is substantially farther away from a nucleus as in an initial energy state/level, atomic vapor may exhibit sensitive responses to external electromagnetic radio-frequency (RF) fields, ranging from several to hundreds of gigahertz (GHz). This coincides with a microwave frequency range between 300 MHz and 300 GHz, respectively.

For quantum sensors of high sensitivity, it is crucial to overlap those sections with highest excitation (laser intensity) and microwave field strength.

Conventionally, this involves directing a laser beam closely along a surface, which implies laborious laser beam alignment in combination with vulnerability to mechanical shocks and temperature changes.

SUMMARY

In view of the above-mentioned drawbacks and limitations, the present disclosure aims to improve RF signal analysis of the background art. An objective is to make RF signal analysis more sensitive, more robust and less burdensome.

The objective is achieved by the embodiments as defined by the appended independent claims. Preferred embodiments are set forth in the dependent claims and in the following description and drawings.

A first aspect of the present disclosure relates to a measurement system for analysing RF signals. The measurement system comprises a optically transparent enclosure comprising an optically pumpable gas, and a printed circuit board, PCB, comprising an electrical transmission line for guiding the RF signal to be analyzed through the enclosure and a reflective planar face. The measurement system further comprises an optical pump for emitting preferably coherent light onto the reflective planar face, and a detector for detecting an optical property of the emitted light being reflected by the reflective planar face.

The gas may comprise an alkali metal, preferably Rubidium.

The transmission line may comprise an insulator layer sandwiched between conductor layers.

The transmission line may include one of: a microstrip, and a coplanar waveguide with ground.

The transmission line may include one of: a reflective coating, and a polished conductor layer.

The reflective coating may comprise one of: a reflective dielectric coating comprising a quarterwave stack of alternating high and low index layers, and a reflective metal coating.

The reflective planar face of the PCB (12A, 12B) may have a reflectance for the emitted light in excess of 80%.

The emitted light may have a wavelength in accordance with an energy transition of the gas, preferably 780 nm or 795 nm.

The optical pump may be arranged to emit the light in a continuous wave, CW, mode or in a pulsed mode.

The optical pump may be arranged to emit the light perpendicularly to a propagation direction of the RF signal.

Propagation directions of the emitted light and the reflected light may form an intermediate angle of at most 174°, preferably at most 160°, more preferably at most 140°, and most preferably 90°.

The detector and the optical pump may be arranged non-coaxially in accordance with the intermediate angle.

The detector may comprise one of: a photodiode, and a camera.

The PCB may comprise two electrical transmission lines on respective reflective planar faces of the PCB; and the measurement system may comprise two optical pumps for emitting light in accordance with an energy transition of the gas, and two detectors for detecting an optical property of the emitted light emitted by the respective optical pump and reflected by the respective reflective planar face.

A second aspect of the present disclosure relates to a method of operating a measurement system for analysing RF signals. The measurement system comprises a optically transparent enclosure comprising an optically pumpable gas, a printed circuit board, PCB, comprising an electrical transmission line, an optical pump, and a detector. The PCB comprises a reflective planar face. The method comprises guiding the RF signal to be analyzed through the enclosure via the transmission line, emitting preferably coherent light onto the reflective planar face, and detecting an optical property of the emitted light being reflected by the reflective planar face.

Advantageous Effects

The present disclosure proposes using a surface of a PCB to reflect light/laser beams, coating and/or polishing the surface of the PCB to improve reflectivity, and choosing the right material for optimizing reflectivity for a particular wavelength.

This provides a better laser/microwave overlap in atomic vapor quantum sensing setups, where it is crucial to overlap the regions with highest laser intensity and microwave field strength, and implies a higher sensitivity of atomic vapor quantum sensors, less effort for laser beam alignment, an improved robustness to mechanical shocks/temperature changes, and a possibility to use both sides of the PCB as reflective surfaces.

Advantageously, the technical effects and advantages described above in relation with the measurement system equally apply to the method of operating the same having corresponding features.

BRIEF DESCRIPTION OF DRAWINGS

The above-described aspects and implementations will now be explained with reference to the accompanying drawings, in which the same or similar reference numerals designate the same or similar elements.

The features of these aspects and implementations may be combined with each other unless specifically stated otherwise.

Figure 1:
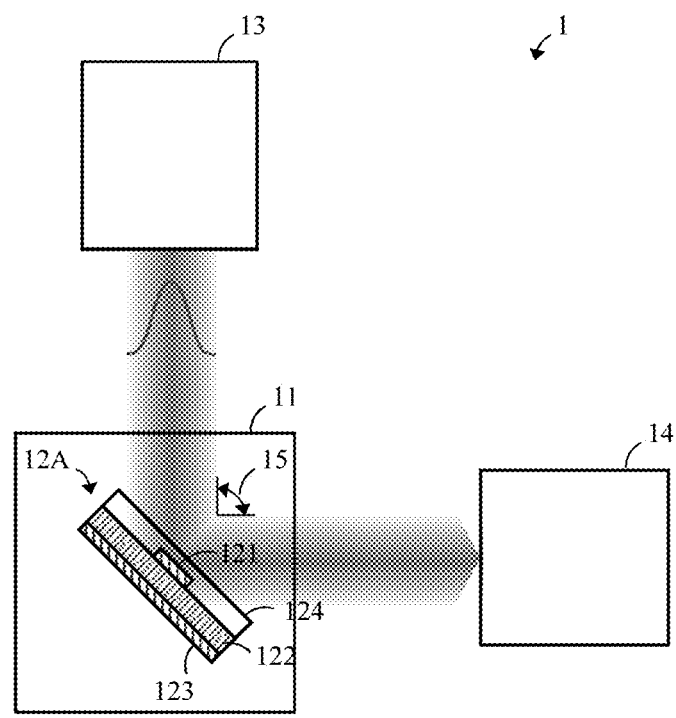

The drawings are to be regarded as being schematic representations, and elements illustrated in the drawings are not necessarily shown to scale. Rather, the various elements are represented such that their function and general purpose become apparent to those skilled in the art.

Figure 2:
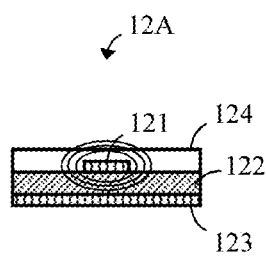
Figure 3:
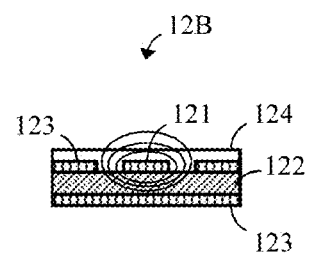
Figure 4:
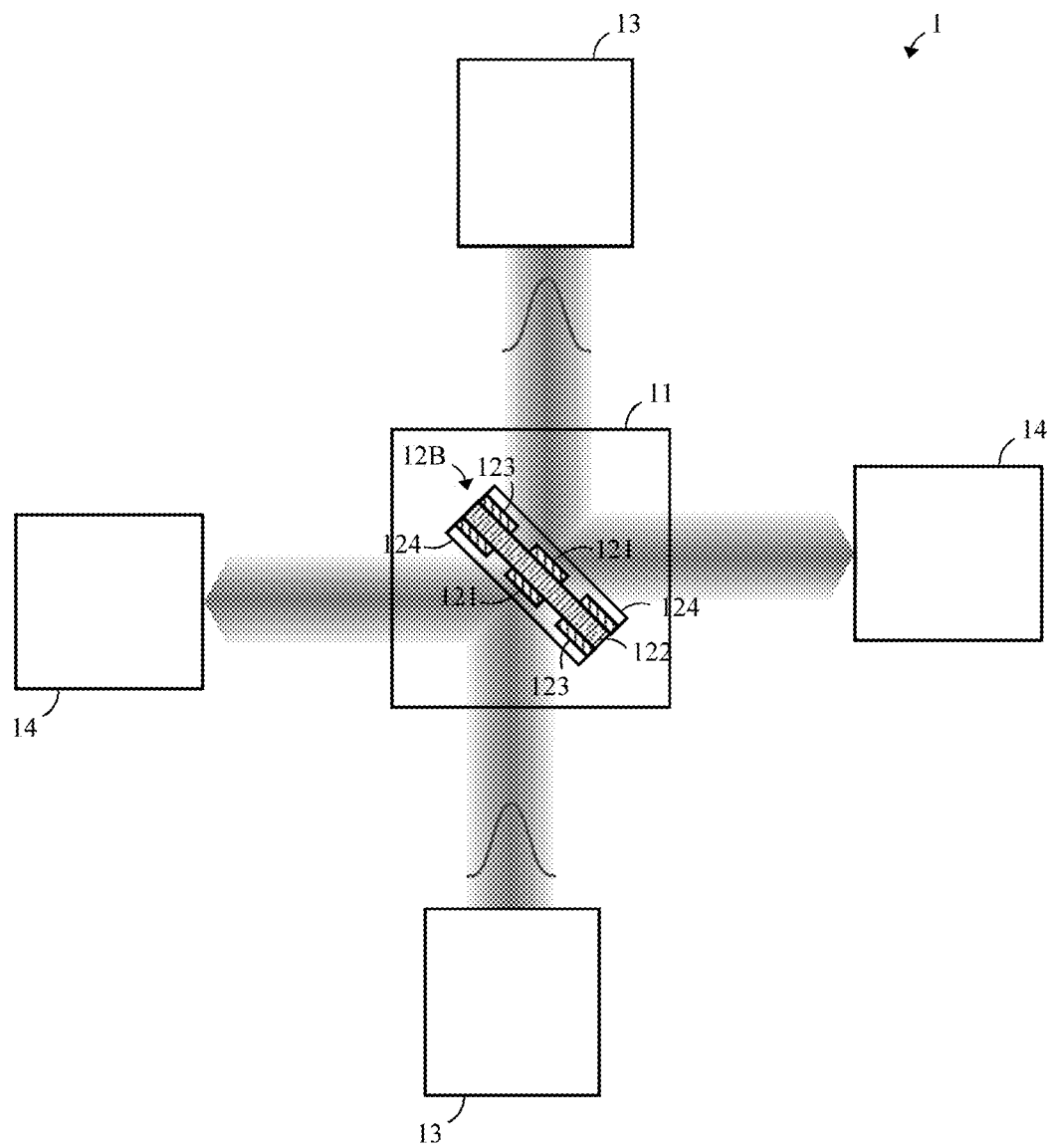
Figure 5:
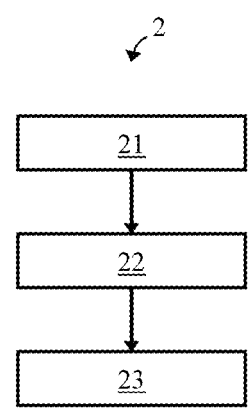

FIG. 1 illustrates a first embodiment of a measurement system according to the present disclosure for analysing RF signals;

FIGS. 2, 3 illustrate various embodiments of a PCB according to the present disclosure for guiding RF signals to be analyzed through an enclosure of the measurement system;

FIG. 4 illustrates a second embodiment of a measurement system according to the present disclosure for analysing RF signals; and FIG. 5 illustrates an embodiment of a method of operating the measurement systems of FIGS. 1 and 2.

DETAILED DESCRIPTIONS OF DRAWINGS

FIG. 1 illustrates a first embodiment of a measurement system 1 according to the present disclosure for analysing RF signals.

The measurement system 1 comprises an optically transparent enclosure 11 comprising an optically pumpable gas. In particular, the optically transparent enclosure 11 may comprise an optically transparent body or window made of optically transparent material such as borosilicate glass or aluminosciliate glass. For example, the enclosure 11 may be a gas cell/atomic vapor cell.

The gas may comprise an alkali metal, preferably Rubidium. Alternatively, Cesium may be used, or even non-alkali metals such as Helium.

The measurement system 1 further comprises-without loss of generality-a PCB 12A comprising an electrical transmission line 121-123 for guiding the RF signal to be analyzed through the enclosure 11.

The transmission line 121-123 may comprise an insulator layer 122 sandwiched between conductor layers 121, 123. The conductor 121 is configured to guide the RF signal to be analyzed through the enclosure 11, and any conductors 123 may relate to a ground potential. Responsive to RF signal propagation along the conductor 121, a non-radiative electromagnetic field emerges in a near-field region of the same. A magnetic portion thereof is illustrated in FIGS. 2 and 3 as closed field lines around the respective conductor 121, whereas field lines of an electric portion thereof (not shown) run perpendicularly to the field lines of the magnetic portion and terminate perpendicularly in the conductors 121, 123.

In particular, the transmission line 121-123 may include one of: a microstrip (see FIG. 2 below), and a coplanar waveguide with ground (see FIG. 3 below). Key point is that the emerging non-radiative electromagnetic field should be able to extend outside the PCB 12A, where the electromagnetic field of the RF signal may interact with the gas particles of the enclosure 11. More specifically, a respective absorption rate of frequency components of the RF signal increases with a respective energy of the frequency components. As such, for a given duration of the emerging non-radiative electromagnetic field, high-energy frequency components achieve a more exhaustive population inversion of the gas particles from the initial state/level to the excited state/level than low-energy frequency components, corresponding to intensity-dependent filtering.

The PCB 12A further comprises a reflective planar face. In particular, the PCB 12A, 12B may include one of: a reflective coating 124; and a polished conductor layer 121, 123.

The reflective coating 124 may comprise one of: a reflective dielectric coating comprising a quarterwave stack of alternating high and low index layers, and a reflective metal coating.

As for reflective dielectric coatings, the so-called quarterwave stack, i.e., a stack of alternating high and low index layers with an optical thickness of $n \cdot t = \lambda/4$ for the desired wavelength $\lambda$ (where n and t relate to a refractive index and a geometrical thickness of the respective layer) achieves constructive interference of the reflected beams arising at each interface between the layers. A spectral width of the reflection band and the achievable reflectivity for a given number of layer pairs depends on the ratio of the refractive indices of the layer materials. For example, a large refractive index ratio yields a broad reflection band.

As for reflective metallic coatings, a surface of which may be oxidation-protected for maintaining a reflection property of the same.

The reflective planar face of the PCB 12A may have a reflectance for the emitted light in excess of 80%. This may be achieved by reflective dielectric coatings based on a quarterwave stack comprising ≥5 pairs of $Ta_2O_5/SiO_2$ in the reflection band 700-900 nm. Similar results may be obtained using pairs of $TiO_2/SiO_2$ layers. On the other hand, the reflective dielectric coatings should be made as thin as possible in order not to shield the emerging near field. A reflectancy in excess of 80% in the reflection band 700-900 nm may also be achieved by reflective metallic surfaces, e.g., polished conductor layers 121, 123 made of one of: aluminum, copper, silver, and gold.

The measurement system 1 further comprises an optical pump 13 for emitting preferably coherent light onto the reflective planar face. In particular, a laser source may be deployed for emitting coherent light.

Depending on the implementation, optical pumping and optical readout may realized by a single pump (as described in this implementation) or by separate pumps. In a setup with separate optical pumps, it would be beneficial if both beams overlap well with the electromagnetic field of the RF signal. If sensing is performed using Rydberg atoms, at least one more optical pump is needed for excitation to the Rydberg state.

The optical pump 13 may be arranged to emit the light in a continuous wave, CW, mode or in a pulsed mode. The emitted light may have a wavelength in accordance with an energy transition of the gas, preferably 780 nm or 795 nm specifically for Rubidium, such that the atoms of the gas may be pumped from a ground energy state/level to highly excited initial energy states/levels wherein an outermost electron is substantially farther away from a nucleus as in the initial energy state/level. For example, the initial energy state of a quantum system based on the atoms of the gas may comprise a Rydberg state. Rydberg states have multiple energy transitions in the GHz-THz range so that they are sensitive to excitation by magnetic fields, and particularly by electric fields, in a wide frequency range. Excitation to Rydberg state may be achieved using at least one further optical pump in addition to said 780/795 nm optical pumps.

The optical pump 13 may be arranged to emit the light perpendicularly to a propagation direction of the RF signal. In the implementation of FIG. 1, the RF signal to be analyzed propagates perpendicular to a drawing plane of FIG. 1, whereas the emitted light propagates within the drawing plane.

Propagation directions of the emitted light and the reflected light may form an intermediate angle 15 of at most 174°, preferably at most 160°, more preferably at most 140°, and most preferably 90°. In other words, directing a laser beam closely along, i.e., substantially parallel to, a surface as known in the art should be avoided.

The measurement system 1 further comprises a detector 14 for detecting an optical property of the emitted light being reflected by the reflective planar face. For example, the optical property may comprise an optical intensity or a photon count.

The detector 14 may comprise one of: a photodiode for punctiform detection, and a camera for spatially resolved detection in accordance with an interaction of the emerging near field of the RF signal to be analyzed and the incident/reflected light beams having spatially resolved intensities (see an exemplary beam intensity profile indicated in FIG. 1 between the optical pump 13 and the enclosure 11). The spatially resolved optical pumping results in spatially resolved population of the initial energy state/level of the quantum system formed by the optically pumpable gas, and thus a spatially resolved (cap) ability of the quantum system to be ionized easily by absorption when exposed to external electro-magnetic RF fields. Such a (near) field may be induced around the electrical transmission line 121-123 when guiding an RF signal to be analyzed through the enclosure 11.

The detector 14 and the optical pump 13 may be arranged non-coaxially in accordance with the intermediate angle 15. An intermediate angle of 90° may simplify the non-coaxial arrangement, whereas larger intermediate angles 15 of less than 180° may further improve a reflection property of the reflective planar face. In a setup with separate optical pumps, only the beam for optical readout needs to be imaged/reflected to the optical detector.

Presence of a magnetic or electric field may be used to cause splitting/shifts of the atomic energy levels in accordance with Zeeman or Stark splitting, which ensures availability of gas particles in an initial state for each frequency in a desired frequency range, such as an RF/microwave frequency range between 300 MHz and 300 GHz, respectively. For particles in the Rydberg state, filtering may be possible up to the THz regime. For initial-state Rubidium atoms in a magnetic field, filtering may be possible up to ~60 GHz.

Zeeman splitting may refer to splitting of a spectral line into several components in the presence of a static magnetic field. Stark splitting, the electric-field analogue of Zeeman splitting, may refer to splitting of a spectral line into several components in the presence of a static electric field.

FIGS. 2, 3 illustrate various embodiments of a PCB 12A, 12B according to the present disclosure for guiding RF signals to be analyzed through an enclosure 11 of the measurement system 1.

The depicted PCBs 12A, 12B respectively comprise an electrical transmission line 121-123 for guiding the RF signal to be analyzed through the enclosure 11 of the measurement system 1.

The respective transmission line 121-123 may comprise an insulator layer 122 sandwiched between conductor layers 121, 123.

The respective transmission line 121-123 includes a microstrip in FIG. 2, and a coplanar waveguide with ground in FIG. 3.

The respective PCB 12A, 12B comprises a reflective planar face in accordance with what has been set out above.

FIG. 4 illustrates a second embodiment of a measurement system 1 according to the present disclosure for analysing RF signals.

As may be taken from FIG. 4, in this embodiment of the measurement system 1 the PCB 12A, 12B may comprise two electrical transmission lines 121-123 on respective reflective planar faces of the PCB 12A, 12B. Without loss of generality, in the implementation of FIG. 4, the PCB 12B comprises two coplanar waveguides with ground arranged back-to-back.

Likewise, this embodiment of the measurement system 1 may comprise two optical pumps 13 for emitting light in accordance with an energy transition of the gas, and two detectors 14 for detecting an optical property of the emitted light emitted by the respective optical pump 13 and reflected by the respective reflective planar face. This may reduce a space requirement of such a twin quantum sensor.

FIG. 5 illustrates an embodiment of a method of operating the measurement systems 1 of FIGS. 1 and 2.

The measurement system 1 to be operated comprises a optically transparent enclosure 11 comprising an optically pumpable gas, a printed circuit board, PCB 12A, 12B comprising an electrical transmission line 121-123, an optical pump 13, and a detector 14. The PCB 12A, 12B further comprises a reflective planar face.

In a first step, the method 2 comprises guiding 21 the RF signal to be analyzed through the enclosure 11 via the transmission line 121-123.

In a second step, the method 2 comprises emitting 22 preferably coherent light onto the reflective planar face.

In a third step, the method 2 comprises detecting 23 an optical property of the emitted light being reflected by the planar face.

The invention claimed is:

1. A measurement system for analysing RF signals, comprising
an optically transparent enclosure comprising an optically pumpable gas;
a printed circuit board, PCB, comprising an electrical transmission line for guiding the RF signal to be analyzed through the enclosure and a reflective planar face;
an optical pump for emitting preferably coherent light onto the reflective planar face; and
a detector for detecting an optical property of the emitted light being reflected by the reflective planar face.

2. The measurement system of claim 1,
the gas comprising an alkali metal, preferably Rubidium.

3. The measurement system of claim 1,
the transmission line comprising an insulator layer sandwiched between conductor layers.

4. The measurement system of claim 3,
the transmission line including one of:
a microstrip; and
a coplanar waveguide with ground.

5. The measurement system of claim 1,
the PCB including one of:
a reflective coating; and
a polished conductor layer.

6. The measurement system of claim 5,
the reflective coating comprising one of:
a reflective dielectric coating comprising a quarterwave stack of alternating high and low index layers; and
a reflective metal coating.

7. The measurement system of claim 1,
the reflective planar face of the PCB having a reflectance for the emitted light in excess of 80%.

8. The measurement system of claim 1,
the emitted light having a wavelength in accordance with an energy transition of the gas, preferably 780 nm or 795 nm.

9. The measurement system of claim 1,
the optical pump arranged to emit the light in a continuous wave, CW, mode or in a pulsed mode.

10. The measurement system of claim 1,
the optical pump arranged to emit the light perpendicularly to a propagation direction of the RF signal.

11. The measurement system of claim 1,
propagation directions of the emitted light and the reflected light forming an intermediate angle of at most 174°, preferably at most 160°, more preferably at most 140°, and most preferably 90°.

12. The measurement system of claim 11,
the detector and the optical pump arranged non-coaxially in accordance with the intermediate angle.

13. The measurement system of claim 1,
the detector comprising one of:
    a photodiode; and
    a camera.

14. The measurement system of claim 1,
the PCB comprising two electrical transmission lines on respective reflective planar faces of the PCB; and
the measurement system comprising
    two optical pumps for emitting light in accordance with an energy transition of the gas; and
    two detectors for detecting an optical property of the emitted light emitted by the respective optical pump and reflected by the respective reflective planar face.

15. A method of operating a measurement system for analysing RF signals,
the measurement system comprising
a optically transparent enclosure comprising an optically pumpable gas;
a printed circuit board, PCB, comprising an electrical transmission line and a reflective planar face;
an optical pump; and
a detector;
the method comprising
guiding the RF signal to be analyzed through the enclosure via the transmission line;
emitting coherent light onto the reflective planar face; and
detecting an optical property of the emitted light being reflected by the reflective planar face.

* * * * *